(12) United States Patent
Tomita et al.

(10) Patent No.: US 8,179,123 B2
(45) Date of Patent: May 15, 2012

(54) MEASUREMENT APPARATUS AND RECORDING MEDIUM

(75) Inventors: Masayuki Tomita, Saitama (JP); Masahiko Muto, Saitama (JP); Takeshi Takahashi, Gunma (JP)

(73) Assignee: Advantest Corporation, Tokyo (JP)

( * ) Notice: Subject to any disclaimer, the term of this patent is extended or adjusted under 35 U.S.C. 154(b) by 361 days.

(21) Appl. No.: 12/614,728

(22) Filed: Nov. 9, 2009

(65) Prior Publication Data

US 2010/0315061 A1    Dec. 16, 2010

Related U.S. Application Data

(63) Continuation of application No. PCT/JP2008/059658, filed on May 26, 2008.

(30) Foreign Application Priority Data

May 28, 2007    (JP) .................................. 2007-140548

(51) Int. Cl.
    *G01R 11/32*    (2006.01)
(52) U.S. Cl. ....................................................... 324/142
(58) Field of Classification Search ................... 324/142
    See application file for complete search history.

(56) References Cited

U.S. PATENT DOCUMENTS

| | | | |
|---|---|---|---|
| 4,104,725 A | 8/1978 | Rose et al. | |
| 5,517,106 A * | 5/1996 | Longini | 324/142 |
| 7,885,360 B2 * | 2/2011 | Tanabe et al. | 375/324 |
| 2003/0090319 A1 | 5/2003 | Ohkawa | |
| 2008/0036470 A1 | 2/2008 | Kurosawa | |

FOREIGN PATENT DOCUMENTS

| | | | |
|---|---|---|---|
| JP | 2-230845 A | 9/1990 | |
| JP | 4-343074 A | 11/1992 | |
| JP | 2001-148635 A | 5/2001 | |
| JP | 2001-223621 A | 8/2001 | |
| JP | 2001-268150 A | 9/2001 | |
| JP | 2006-84277 A | 3/2006 | |
| TW | 357267 A | 5/1999 | |
| WO | 01/99316 A1 | 12/2001 | |

OTHER PUBLICATIONS

International Search Report (ISR) for PCT/JP2008/059658 for Examiner consideration, ISR mailing date: Jul. 1, 2008.
Written Opinion (PCT/ISA/237) of PCT/JP2008/059658, Written Opinion mailing date: Jul. 1, 2008.
Taiwanese Office Action dated Feb. 7, 2012, in a counterpart Taiwanese patent application No. 097119713. (This Taiwanese OA cites U.S. Patent No. 1 and Foreign Patent document Nos. 1-3 listed above, and JP2001-148635 which have been submitted in a previous IDS.).

* cited by examiner

*Primary Examiner* — Amy He
(74) *Attorney, Agent, or Firm* — Chen Yoshimura LLP

(57) ABSTRACT

Provided is a measurement apparatus that measures power of a modulated signal that is modulated with a carrier signal having a prescribed frequency, comprising an AD converting section that outputs a digital modulated signal obtained by AD converting the modulated signal; a frequency converting section that converts the digital modulated signal into a frequency component signal representing a plurality of signal components at respective frequencies; a correction coefficient output section that outputs, for each frequency, a correction coefficient corresponding to a frequency characteristic of a transmission path on which the modulated signal is transmitted; a correcting section that corrects the signal component of each frequency in the frequency component signal using the correction coefficient of the corresponding frequency; and a power calculating section that calculates the power of the modulated signal based on the signal component of each frequency in the corrected frequency component signal.

7 Claims, 6 Drawing Sheets

| RESOLUTION (Hz) d | FREQUENCY (Hz) s | FFT SAMPLING FREQUENCY m | THINNING RATE x |
|---|---|---|---|
| 10 | 81.92k | 8192 | 3000 |
| 100 | 819.2k | 8192 | 300 |
| 1k | 64k | 64 | 3840 |
| 20k | 1.28M | 64 | 192 |
| 120k | 7.68M | 64 | 32 |
| 3840k | 245.76M | 64 | 1 |
| 1k | 4.096M | 4096 | 60 |
| 1k | 8.192M | 8192 | 30 |
| 5k | 20.48M | 4096 | 12 |
| 5k | 40.96M | 8192 | 6 |
| 10k | 40.96M | 4096 | 6 |
| 10k | 81.92M | 8192 | 3 |

SAMPLING FREQUENCY (fs) = 245.76M (Hz)

FIG. 5

MEASUREMENT APPARATUS AND RECORDING MEDIUM

CROSS REFERENCE TO RELATED APPLICATION

This is a continuation application of PCT/JP2008/059658 filed on May 26, 2008 which claims priority from a Japanese Patent Application No. 2007-140548 filed on May 28, 2007, the contents of which are incorporated herein by reference.

BACKGROUND

1. Technical Field

The present invention relates to a measurement apparatus and a program. In particular, the present invention relates to a measurement apparatus and a recording medium storing therein a program for measuring power of a modulated signal obtained by modulating a carrier signal having a prescribed frequency.

2. Related Art

In recent years, the band of modulated signals used in wireless communication has widened significantly. When measuring the power of a wideband modulated signal, the signal decays in the analog input path of the power measurement apparatus. Therefore, when measuring the power of a wideband modulated signal, the power measurement apparatus corrects the measurement result using a digital filter or the like.

This technology is disclosed in, for example, Japanese Patent Application Publication No. 2006-84277.

However, in order to filter the wideband signal, the measurement apparatus must be provided with a large filter circuit.

SUMMARY

Therefore, it is an object of an aspect of the innovations herein to provide a measurement apparatus and a recording medium storing therein a program, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, provided is a measurement apparatus that measures power of a modulated signal that is modulated with a carrier signal having a prescribed frequency, comprising an AD converting section that outputs a digital modulated signal obtained by AD converting the modulated signal; a frequency converting section that converts the digital modulated signal into a frequency component signal representing a plurality of signal components at respective frequencies; a correction coefficient output section that outputs, for each frequency, a correction coefficient corresponding to a frequency characteristic of a transmission path on which the modulated signal is transmitted; a correcting section that corrects the signal component of each frequency in the frequency component signal using the correction coefficient of the corresponding frequency; and a power calculating section that calculates the power of the modulated signal based on the signal component of each frequency in the corrected frequency component signal.

According to a second aspect related to the innovations herein, provided is a recording medium storing therein a program that causes an information processing apparatus to function as a measurement apparatus that measures power of a modulated signal modulated with a carrier signal having a prescribed frequency, the program causing the information processing apparatus to function as an AD converting section that outputs a digital modulated signal by AD converting the modulated signal; a frequency converting section that converts the digital modulated signal into a frequency component signal representing a plurality of signal components at respective frequencies; a correction coefficient output section that outputs, for each frequency, a correction coefficient corresponding to a frequency characteristic of a transmission path on which the modulated signal is transmitted; a correcting section that corrects the signal component of each frequency in the frequency component signal using the correction coefficient of the corresponding frequency; and a power calculating section that calculates the power of the modulated signal based on the signal component of each frequency in the corrected frequency component signal.

According to a third aspect related to the innovations herein, provided is a measurement apparatus that measures power of an input signal, comprising a signal acquiring section that acquires the input signal; a frequency converting section that converts the input signal into a frequency component signal representing a plurality of components at respective frequencies; a correcting section that performs a correction for each frequency according to a frequency characteristic of a transmission path on which the input signal is transmitted; and a power calculating section that calculates the power of the input signal based on the signal component of each frequency in the corrected frequency component signal.

The summary clause does not necessarily describe all necessary features of the embodiments of the present invention. The present invention may also be a sub-combination of the features described above.

BRIEF DESCRIPTION OF THE DRAWINGS

FIG. 5 shows an exemplary HT sampling frequency and thinning rate for the frequency span and resolution.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
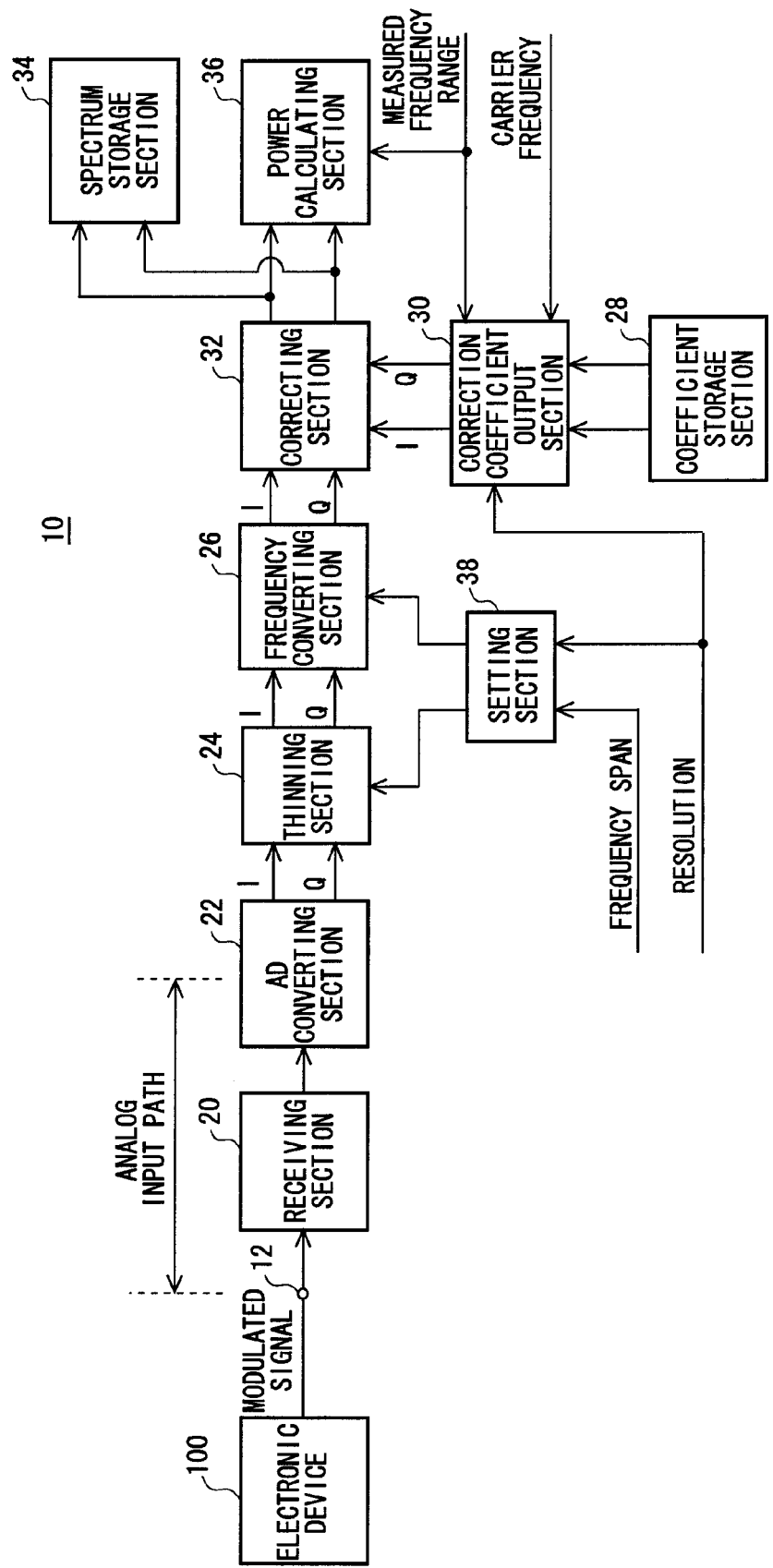
FIG. 1 shows a configuration of a measurement apparatus 10 according to an embodiment of the present invention, along with an electronic device 100.
Figure 2:
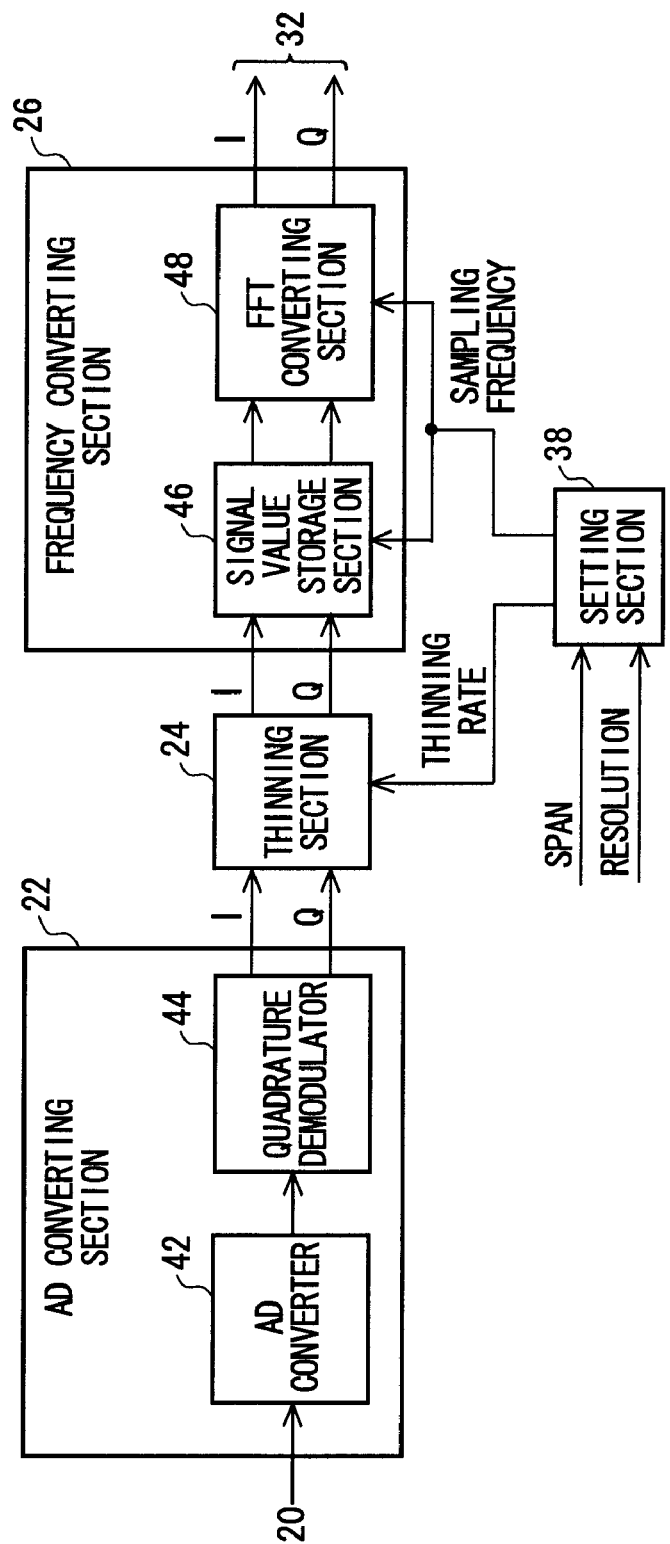
FIG. 2 shows configurations of an AD converting section 22, a thinning section 24, and a frequency converting section 26 shown in FIG. 1.

FIG. 1 shows a configuration of a measurement apparatus 10 according to an embodiment of the present invention, along with an electronic device 100. FIG. 2 shows configurations of an AD converting section 22, a thinning section 24, and a frequency converting section 26 shown in FIG. 1. The measurement apparatus 10 measures power of a modulated signal modulated with a carrier signal having a prescribed frequency. For example, the measurement apparatus 10 receives a modulated signal from the electronic device 100 via input end 12 and measures the power of the received modulated signal in a frequency range designated by a user.

The measurement apparatus 10 is provided with a receiving section 20, the AD converting section 22, the thinning section 24, the frequency converting section 26, a coefficient storage section 28, a correction coefficient output section 30, a correcting section 32, a spectrum storage section 34, a power calculating section 36, and a setting section 38.

The receiving section 20 performs amplification, frequency shifting, filtering, or the like on the modulated signal input via the input end 12. The receiving section 20 outputs an intermediate frequency signal that is obtained by frequency shifting the modulated signal.

The AD converting section 22 outputs a digital modulated signal obtained by AD converting the intermediate frequency signal output from the receiving section 20. In the present embodiment, the AD converting section 22 outputs a baseband signal, i.e. an I-signal and a Q-signal, obtained by quadrature demodulating the digital modulated signal.

The AD converting section 22 may include an AD converter 42 and a quadrature demodulating section 44, as shown in FIG. 2. The AD converter 42 AD converts the intermediate frequency signal with a prescribed sampling frequency. The quadrature demodulating section 44 performs digital quadrature demodulation on the AD-converted signal, and outputs the baseband signal, i.e. the I-signal and the Q-signal, obtained as a result of the quadrature demodulation. Instead of the configuration shown in FIG. 2, the AD converting section 22 may include a quadrature demodulator that quadrature demodulates the intermediate frequency signal and outputs the I-signal and the Q-signal, an I-side AD converter that digitizes the I-signal output from the quadrature demodulator, and a Q-side AD converter that digitizes the Q-signal output from the quadrature demodulator.

The thinning section 24 thins the signal value of the digital modulated signal output from the AD converting section 22, which is the baseband signal in the present embodiment, according to a designated thinning rate. For example, the thinning section 24 may thin the signal values according to a thinning rate designated from a sequence of signal values of the baseband signal using a CIC filter and an FIR filter, or the like. In this way, the thinning section 24 can output a baseband signal with a sampling frequency that is lower than the sampling frequency of the AD converter 42.

The frequency converting section 26 converts the baseband signal output from the thinning section 24 into a frequency component signal representing a signal component at each frequency. For example, the frequency converting section 26 may generate the frequency component signal by performing a Fourier transform on the baseband signal.

The frequency converting section 26 may include a signal value storage section 46 and an FFT converting section 48, as shown in FIG. 2. The signal value storage section 46 stores the signal values of the thinned baseband signal output from the thinning section 24. The signal value storage section 46 stores signal values with a designated sampling frequency. For example, the signal value storage section 46 is supplied with a trigger indicating an acquisition initiation timing, acquires signal values for a number of samples designated by the trigger, and stores these signal values.

The FFT converting section 48 performs a fast Fourier transform (FFT) on the baseband signal stored in the signal value storage section 46, that is, the signal values for the designated number of samples. As a result, the FFT converting section 48 can convert the baseband signal representing a signal value at each point in time into a frequency component signal that represents a signal component at each frequency. For example, the FFT converting section 48 may generate a frequency component signal that represents signal components for the designated number of samples, i.e. the number of frequencies. In the present embodiment, the FFT converting section 48 may generate a frequency component signal that represents the I-component and the Q-component for each frequency.

The coefficient storage section 28 stores a correction coefficient for each frequency according to the frequency characteristic of a transmission line on which the modulated signal is transmitted. In the present embodiment, the coefficient storage section 28 stores a correction coefficient for each frequency represented by the I-component and the Q-component. For example, the coefficient storage section 28 stores a correction coefficient for each frequency according to the frequency characteristic of the analog input path, which is from the input end 12 of the measurement apparatus 10 to a point at which AD conversion is performed. The analog input path may include a transmission path of the analog signal inside the AD converting section 22, e.g. a computational amplifier at the input stage. The coefficient storage section 28 may store a correction coefficient for each frequency that represents an inverse of the frequency characteristic of the transmission path on which the modulated signal is transmitted.

The correction coefficient output section 30 reads the correction coefficient for each frequency from the coefficient storage section 28 and outputs the read correction coefficients to the correcting section 32. The correction coefficient output section 30 may output the correction coefficients of the frequencies corresponding to the plurality of signal components in the frequency component signal output from the frequency converting section 26.

The correcting section 32 corrects the signal component of the frequencies included in the frequency component signal using the correction coefficient of the corresponding frequency. For example, the correcting section 32 may correct each signal component of the frequencies included in at least a range of the frequency component signal corresponding to the frequency range being measured, using the correction coefficient of the corresponding frequency. In the present embodiment, the correcting section 32 performs complex multiplication of (i) the signal components (I-component and Q-component) at each frequency of the frequency component signal and (ii) the correction coefficient (I-component and Q-component) of the corresponding frequency.

The spectrum storage section 34 stores the frequency component signal corrected by the correcting section 32. In this way, the spectrum storage section 34 can store a spectrum of the modulated signal.

The power calculating section 36 calculates the power of the modulated signal based on the signal component at each frequency of the frequency component signal corrected by the correcting section 32. In the present embodiment, the power calculating section 36 uses Expression 1 to calculate the power value P of the modulated signal.

$$P = \Sigma(I^2 + Q^2) \hspace{2cm} \text{Expression 1}$$

In other words, the power calculating section 36 calculates, for each frequency, a value obtained by adding together the square of the I-component and the square of the Q-component in the corrected frequency component signal, i.e. a square added value ($I^2+Q^2$). The power calculating section 36 calculates the power value P to be a value obtained by adding together all of the square added values ($I^2+Q^2$) corresponding to the frequency in the measured frequency range.

The setting section 38 sets a sampling frequency for the frequency converting section 26 performing the Fourier transform on the digital modulated signal, according to the frequency span and resolution of the frequency component signal supplied thereto. Furthermore, the setting section 38 sets the thinning rate for the thinning section 24 according to the frequency span and resolution of the frequency component signal supplied thereto. For example, the setting section 38 may set the sampling frequency with which the frequency converting section 26 performs the Fourier transform on the digital modulated signal and the thinning rate for the thinning section 24 according to a frequency span and resolution designated by the user.

The measurement apparatus 10 described above can calculate the power of the modulated signal for which the signal decay caused by the modulated signal being transmitted in a transmission path is corrected. For example, the measurement apparatus 10 can calculate the power of the modulated signal for which the signal decay caused by the modulated signal being transmitted in a path from the input end 12 to the point at which AD conversion is corrected. In this way, the measurement apparatus 10 can accurately measure the power.

Figure 3:
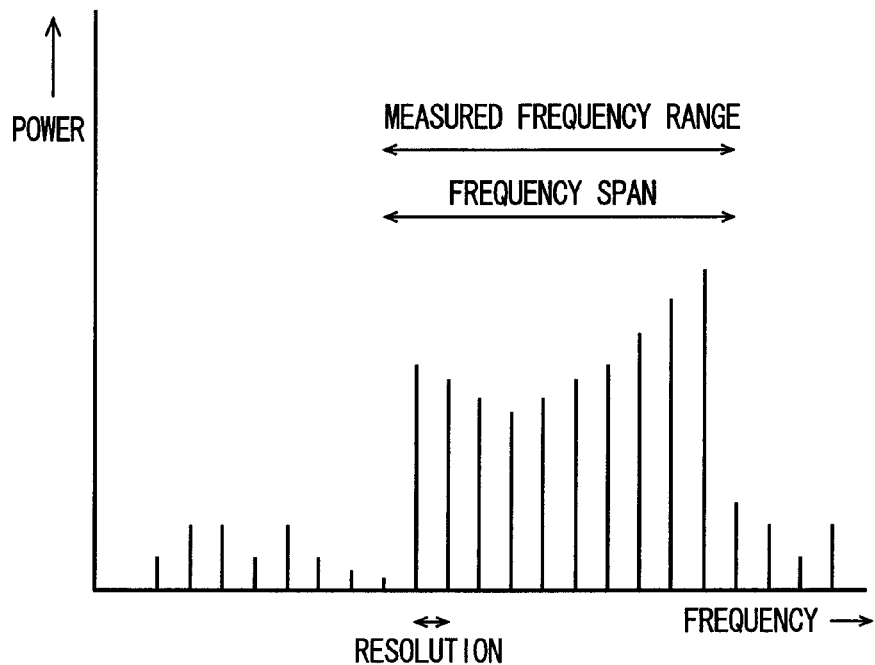
FIG. 3 shows an exemplary modulated signal in a graph having frequency as the horizontal axis and power as the vertical axis.
Figure 4:
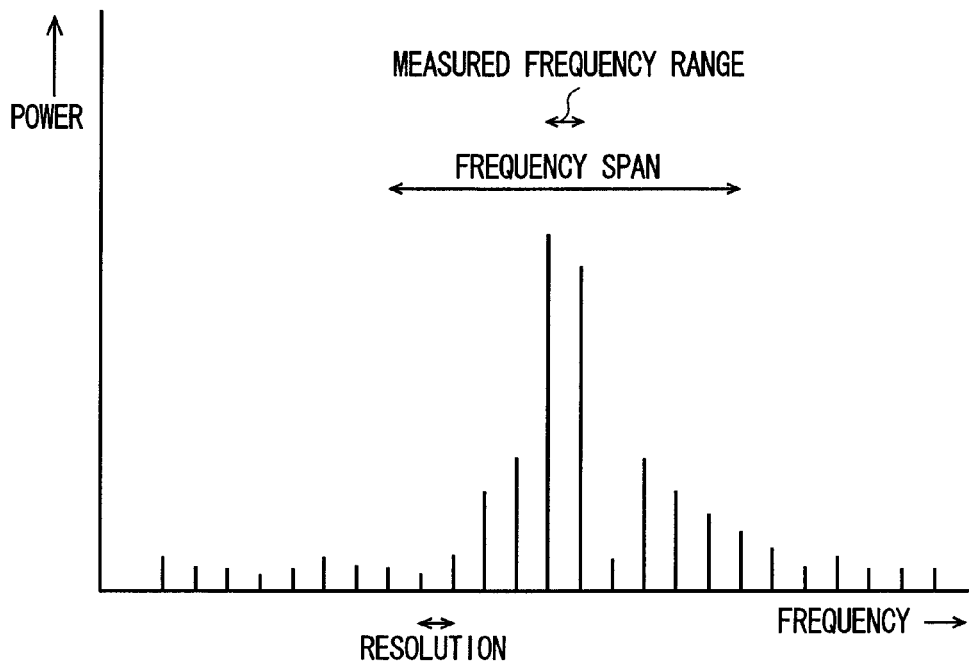
FIG. 4 shows another exemplary modulated signal in a graph having frequency as the horizontal axis and power as the vertical axis.

FIGS. 3 and 4 show exemplary modulated signals in graphs having frequency as the horizontal axes and power as the vertical axes. The frequency span supplied to the setting section 38 is a frequency region from a minimum frequency, e.g. 0 Hz, to a maximum frequency of signal components included in the frequency component signal output from the FFT converting section 48. The resolution supplied to the setting section 38 represents the frequency intervals between adjacent frequency components in the frequency component signal output from the FFT converting section 48.

The measured frequency range represents the frequency range for which the power of the modulated signal is calculated. The measured frequency range may be a range at least including the frequency span, or a range that is equivalent to the frequency span.

FIG. 5 shows an exemplary FFT sampling frequency and thinning rate for the frequency span and resolution. If the resolution is represented as d and the frequency span is represented as S, the setting section 38 can use Expression 2 to calculate the number of samples m of the FFT.

$$m = S/d \qquad \text{Expression 2}$$

In other words, the setting section 38 can calculate the number of samples m of the FFT by dividing the frequency span S by the resolution d.

If fs is used to represent the sampling frequency of the digital modulated signal, which is a baseband signal in the present embodiment, output by the AD converting section 22, then the setting section 38 can use Expression 3 to calculate the thinning rate X.

$$X = fs/(m \times d) \qquad \text{Expression 3}$$

In other words, the setting section 38 can calculate the thinning rate X by dividing the sampling frequency fs by the product ($m \times d$) of the number of samples m of the FFT and the resolution d.

In the present embodiment, the thinning rate X represents a number of input samples for output of a single sample. In other words, the thinning section 24 of the present embodiment performs the thinning by outputting one signal value for each set of X input signal values.

In this way, the setting section 38 can change the number of samples m of the FFT and the thinning rate X according to the frequency span S and the resolution d. Therefore, the measurement apparatus 10 can change the measured frequency range and the measurement precision.

Figure 6:
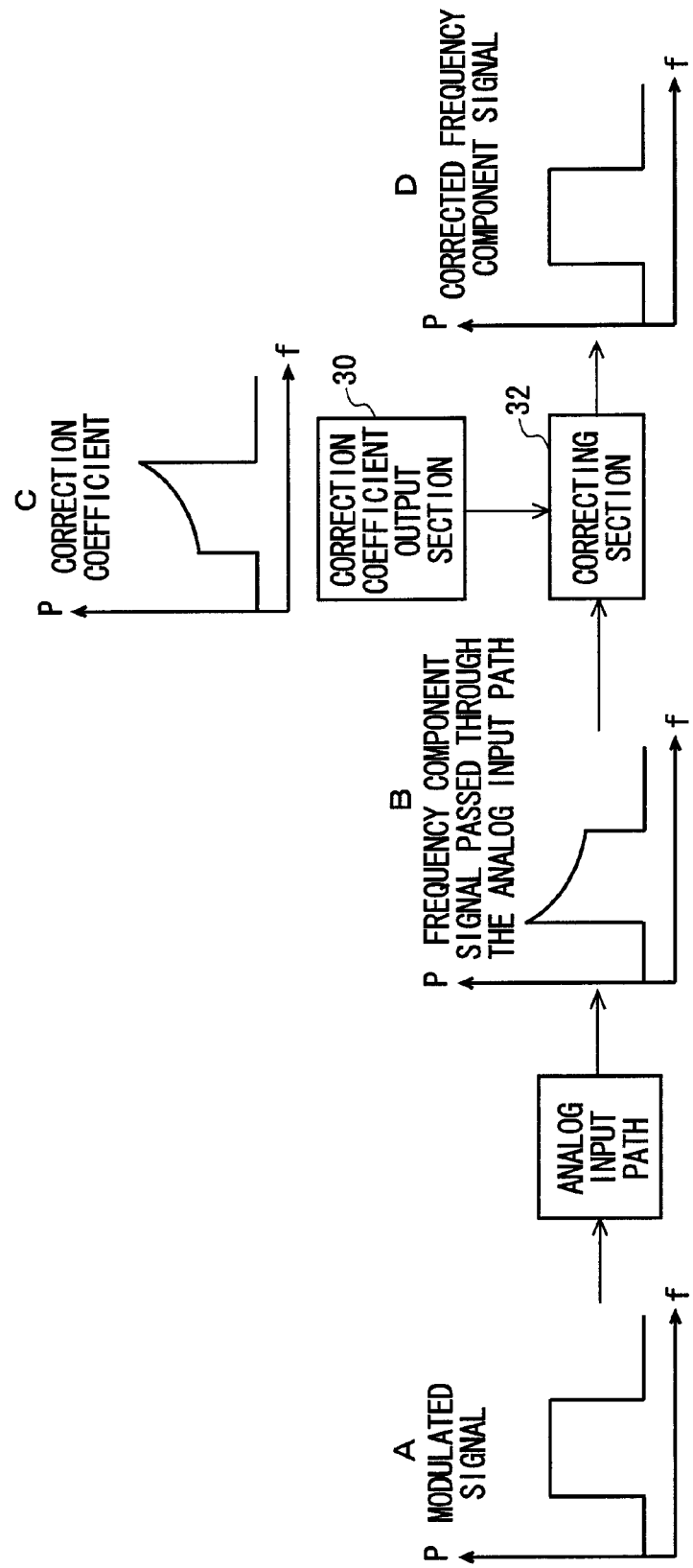
FIG. 6 shows examples of each signal transmitted in the measurement apparatus 10 of the present embodiment.

FIG. 6 shows examples of each signal transmitted in the measurement apparatus 10 of the present embodiment. The analog input path of the measurement apparatus 10 distorts the input modulated signal until the signal reaches the correcting section 32. Accordingly, when the measurement apparatus 10 receives a modulated signal having a flat frequency characteristic, as shown by A of FIG. 6, the correcting section 32 is supplied with a frequency component signal that is distorted according to the frequency characteristic of the analog input path, as shown by B in FIG. 6.

The correction coefficient output section 30 may output, to the correcting section 32, a correction coefficient corresponding to the inverse of the frequency characteristic of the analog input path, as shown by C in FIG. 6. The correcting section 32 uses this correction coefficient (C) to correct the frequency component signal (B) distorted according to the frequency characteristic of the analog input path. As a result, the correcting section 32 can output a frequency component signal having a flat frequency characteristic, as shown by D in FIG. 6.

The corrected frequency component signal (D) output by the correcting section 32 has the same frequency characteristic as the modulated signal (A) input to the measurement apparatus 10. In this way, the correcting section 32 can remove the distortion corresponding to the frequency characteristic of the analog input path.

The correction coefficient output section 30 may change the output correction coefficient according to the measured frequency range designated by the user. For example, the correction coefficient output section 30 may select a correction coefficient corresponding to the measured frequency range of the frequency component signal, and output the selected correction coefficient to the correcting section 32. In this way, the correcting section 32 can correct the distortion caused by the analog input path in at least the signal components corresponding to frequencies within the measured frequency range.

The correction coefficient output section 30 may change the output correction coefficients according to the frequency of the carrier signal. For example, the correction coefficient output section 30 may select correction coefficients corresponding to a frequency range near the carrier signal, and output the selected correction coefficients to the correcting section 32. In this way, when measuring the signal power of the carrier signal, the correcting section 32 can correct the distortion caused by the analog input path in at least the carrier signal.

The correction coefficient output section 30 may change the output correction coefficients according to the resolution of the frequency component signal. For example, the correction coefficient output section 30 may output correction coefficients at frequencies corresponding to the signal components of the frequency component signal. For example, if the resolution of the frequency component signal is 10 Hz, the correction coefficient output section 30 may output correction coefficients at frequencies having 10 Hz intervals that match the frequencies of the signal components of the frequency component signal.

The correction coefficient output section 30 may select, from among a group of correction coefficients stored in the coefficient storage section 28, correction coefficients at frequencies corresponding to the frequencies of the signal components of the frequency component signal, and output the selected correction coefficients. If none of the correction coefficients in the group of correction coefficients stored in the coefficient storage section 28 have a frequency that matches the frequency of a signal component ion the frequency component signal, the correction coefficient output section 30 may interpolate, based on the group of correction coefficients stored in the coefficient storage section 28, correction coefficients at frequencies corresponding to the frequencies of the signal components in the frequency component signal. In this way, the correcting section 32 can perform accurate correction using correction coefficients at frequencies corresponding to the level of each frequency in the frequency component signal.

Figure 7:
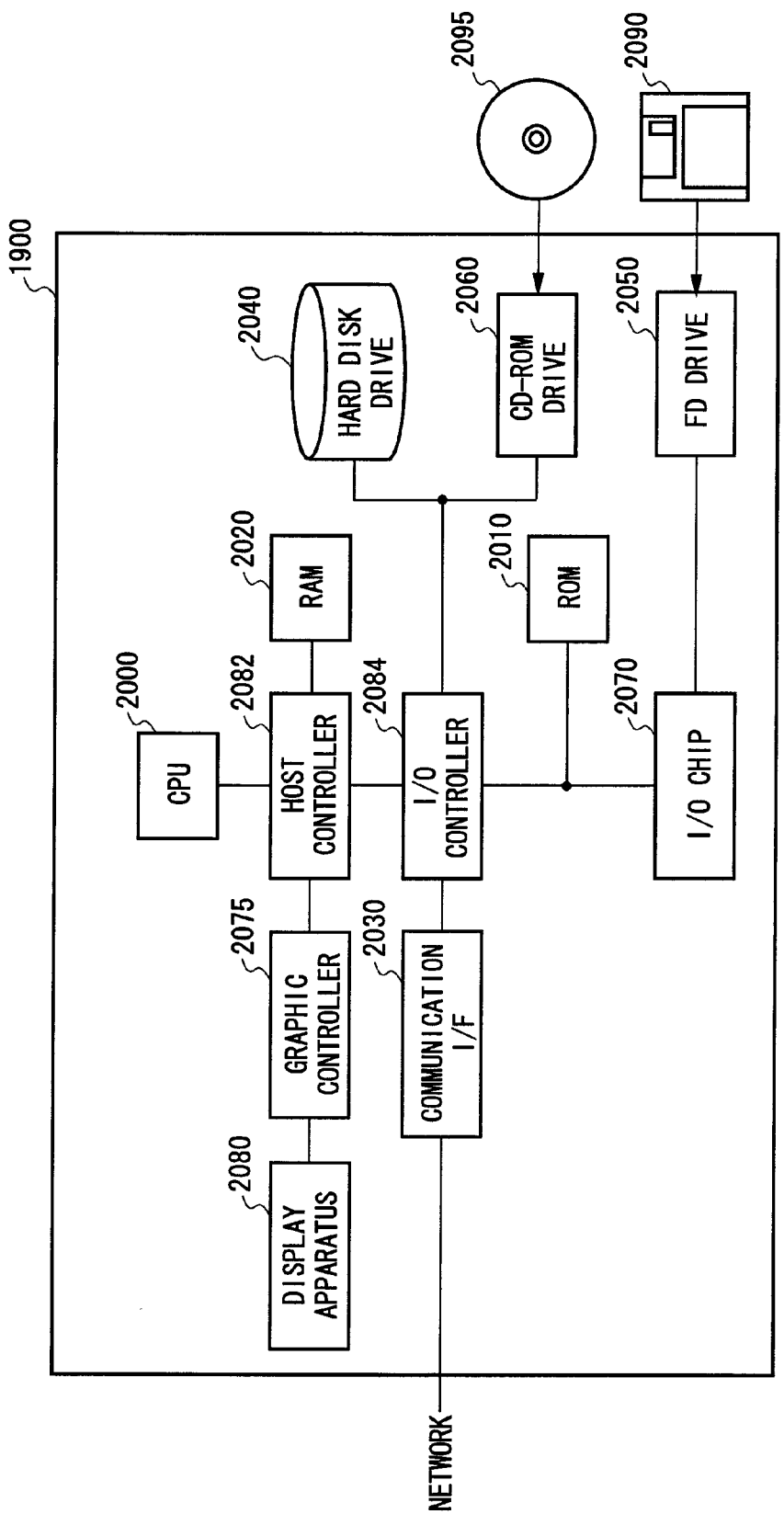
FIG. 7 shows an example of a hardware configuration of a computer 1900 according to the present embodiment.

FIG. 7 shows an example of a hardware configuration of a computer 1900 according to the present embodiment. The computer 1900 according to the present embodiment is provided with a CPU peripheral including a CPU 2000, a RAM 2020, a graphic controller 2075, and a displaying apparatus 2080, all of which are connected to each other by a host controller 2082; an input/output section including a communication interface 2030, a hard disk drive 2040, and a CD-ROM drive 2060, all of which are connected to the host controller 2082 by an input/output controller 2084; and a legacy input/output section including a ROM 2010, a flexible disk drive 2050, and an input/output chip 2070, all of which are connected to the input/output controller 2084.

The host controller 2082 is connected to the RAM 2020 and is also connected to the CPU 2000 and graphic controller 2075 accessing the RAM 2020 at a high transfer rate. The CPU 2000 operates to control each section based on programs stored in the ROM 2010 and the RAM 2020. The graphic controller 2075 acquires image data generated by the CPU 2000 or the like on a frame buffer disposed inside the RAM 2020 and displays the image data in the displaying apparatus 2080. Instead, the graphic controller 2075 may internally include the frame buffer storing the image data generated by the CPU 2000 or the like.

The input/output controller 2084 connects the communication interface 2030 serving as a relatively high speed input/output apparatus, the hard disk drive 2040, and the CD-ROM drive 2060 to the host controller 2082. The communication interface 2030 communicates with other apparatuses via a network. The hard disk drive 2040 stores the programs and data used by the CPU 2000 housed in the computer 1900. The CD-ROM drive 2060 reads the programs and data from a CD-ROM 2095 and provides the read information to the hard disk drive 2040 via the RAM 2020.

Furthermore, the input/output controller 2084 is connected to the ROM 2010, and is also connected to the flexible disk drive 2050 and the input/output chip 2070 serving as a relatively high speed input/output apparatus. The ROM 2010 stores a boot program performed when the computer 1900 starts up, a program relying on the hardware of the computer 1900, and the like. The flexible disk drive 2050 reads programs or data from a flexible disk 2090 and supplies the read information to the hard disk drive 2040 via the RAM 2020. The input/output chip 2070 connects the flexible disk drive 2050 to each of the input/output apparatuses via, for example, a parallel port, a serial port, a keyboard port, a mouse port, or the like.

The programs provided to the hard disk drive 2040 via the RAM 2020 are stored in a storage medium, such as the flexible disk 2090, the CD-ROM 2095, or an IC card, and provided by a user. The programs are read from storage medium, installed in the hard disk drive 2040 inside the computer 1900 via the RAM 2020, and performed by the CPU 2000.

The programs installed in the computer 1900 to make the computer 1900 function as the measurement apparatus 10 are provided with a receiving module, an AD converting module, a thinning module, a frequency converting module, a coefficient storage module, a correction coefficient output module, a correcting module, a spectrum storage module, a power calculating module, and a setting module. These programs and modules prompt the CPU 2000 or the like to make the computer 1900 function as the AD converting section 22, the thinning section 24, the frequency converting section 26, the coefficient storage section 28, the correction coefficient output section 30, the correcting section 32, the spectrum storage section 34, the power calculating section 36, and the setting section 38, respectively.

The programs and modules shown above may also be stored in an external storage medium. The flexible disk 2090, the CD-ROM 2095, an optical storage medium such as a DVD or CD, a magneto-optical storage medium, a tape medium, a semiconductor memory such as an IC card, or the like can be used as the storage medium. Furthermore, a storage apparatus such as a hard disk or RAM that is provided with a server system connected to the Internet or a specialized communication network may be used to provide the programs to the computer 1900 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A measurement apparatus that measures power of a modulated signal that is modulated with a carrier signal having a prescribed frequency, comprising:
    an AD converting section that outputs a digital modulated signal obtained by AD converting the modulated signal;
    a frequency converting section that converts the digital modulated signal into a frequency component signal representing a plurality of signal components at respective frequencies;
    a correction coefficient output section that outputs, for each frequency, a correction coefficient corresponding to a frequency characteristic of a transmission path on which the modulated signal is transmitted;
    a correcting section that corrects the signal component of each frequency in the frequency component signal using the correction coefficient of the corresponding frequency; and
    a power calculating section that calculates the power of the modulated signal based on the signal component of each frequency in the corrected frequency component signal.

2. The measurement apparatus according to claim 1, wherein
    the frequency converting section generates the frequency component signal by performing a Fourier transform on the digital modulated signal, and
    the measurement apparatus further comprises a setting section that sets a number of samples used in the Fourier transform of the digital modulated signal by the frequency converting section according to a frequency span and resolution of the frequency component signal.

3. The measurement apparatus according to claim 1, further comprising:
   a thinning section that thins signal values of the digital modulated signal; and
   a setting section that sets a thinning rate of the thinning section according to a frequency span and resolution of the frequency component signal.

4. The measurement apparatus according to claim 1, wherein
   the correction coefficient output section changes the output correction coefficients according to resolution of the frequency component signal.

5. The measurement apparatus according to claim 1, wherein
   the correction coefficient output section changes the output correction coefficients according to frequency of the carrier signal.

6. A recording medium storing therein a program that causes an information processing apparatus to function as a measurement apparatus that measures power of a modulated signal modulated with a carrier signal having a prescribed frequency, the program causing the information processing apparatus to function as:
   an AD converting section that outputs a digital modulated signal by AD converting the modulated signal;
   a frequency converting section that converts the digital modulated signal into a frequency component signal representing a plurality of signal components at respective frequencies;
   a correction coefficient output section that outputs, for each frequency, a correction coefficient corresponding to a frequency characteristic of a transmission path on which the modulated signal is transmitted;
   a correcting section that corrects the signal component of each frequency in the frequency component signal using the correction coefficient of the corresponding frequency; and
   a power calculating section that calculates the power of the modulated signal based on the signal component of each frequency in the corrected frequency component signal.

7. A measurement apparatus that measures power of an input signal, comprising:
   a signal acquiring section that acquires the input signal;
   a frequency converting section that converts the input signal into a frequency component signal representing a plurality of components at respective frequencies;
   a correcting section that performs a correction for each frequency according to a frequency characteristic of a transmission path on which the input signal is transmitted; and
   a power calculating section that calculates the power of the input signal based on the signal component of each frequency in the corrected frequency component signal.

* * * * *